(12) United States Patent  
Kang (10) Patent No.: US 7,382,203 B2  
(45) Date of Patent: Jun. 3, 2008

(54) VOLTAGE CONTROLLED OSCILLATOR AND DELAY CIRCUIT THEREOF

(75) Inventor: Han-Chang Kang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 133 days.

(21) Appl. No.: 11/384,453

(22) Filed: Mar. 21, 2006

(65) Prior Publication Data

US 2006/0214739 A1    Sep. 28, 2006

(30) Foreign Application Priority Data

Mar. 22, 2005   (TW) ............................ 94108733 A (51) Int. Cl.  
*H03K 3/03* (2006.01)

(52) U.S. Cl. .......................... 331/57; 331/185

(58) Field of Classification Search ............... 331/57, 331/185  
See application file for complete search history.

(56) References Cited

U.S. PATENT DOCUMENTS

2006/0091967 A1* 5/2006 Iozsef et al. .............. 331/57

2006/0097805 A1* 5/2006 Bas et al. .................. 331/57

OTHER PUBLICATIONS

Behzad Razavi, Design of Analog CMOS Integrated Circuits, Jan. 1, 2001, p. 510-521, Chapter 14, McGraw-Hill, Boston.

* cited by examiner

*Primary Examiner*—Joseph Chang  
(74) *Attorney, Agent, or Firm*—Winston Hsu (57) ABSTRACT

A delay circuit, which is included in a ring oscillator, comprises a current source for providing a current; a first circuit coupled to the current source for receiving an input signal and producing an output signal; a second circuit coupled to the current source and the first circuit; a first adjustable impedance element coupled to the first circuit; a second adjustable impedance element coupled to the second circuit; and a control circuit coupled to the first adjustable impedance element and the second adjustable impedance element for producing a first control signal to control a first resistance of the first adjustable impedance element and producing a second control signal to control a second resistance of the second adjustable impedance element; wherein the first adjustable impedance element includes at least one transistor operated in linear region, and the second adjustable impedance element also includes at least one transistor operated in linear region.

19 Claims, 7 Drawing Sheets

VOLTAGE CONTROLLED OSCILLATOR AND DELAY CIRCUIT THEREOF

BACKGROUND OF INVENTION

1. Field of the Invention

The invention relates to an oscillator, and more particularly, to a voltage controlled oscillator.

2. Description of the Prior Art

The performance of voltage controlled oscillator (VCO) can be evaluated with phase jitter, phase noise or $K_{VCO}$ (the proportion of the output oscillating frequency variance corresponding to the input control voltage $V_{in}$ variance). Generally, if the amplitude of the output signal of the voltage controlled oscillator is larger or similar to square wave, the jitter and phase noise of the output signal will be also smaller; oppositely, if the amplitude is smaller, the jitter and phase noise of the output signal will be larger. Hence, if the amplitude of the output signal can be kept stable while changing the input voltage for controlling the output frequency, the signal to noise ratio (SNR) can be retained. It's an important requirement for the voltage controlled oscillator with wild amplitude range.

Figure 1:
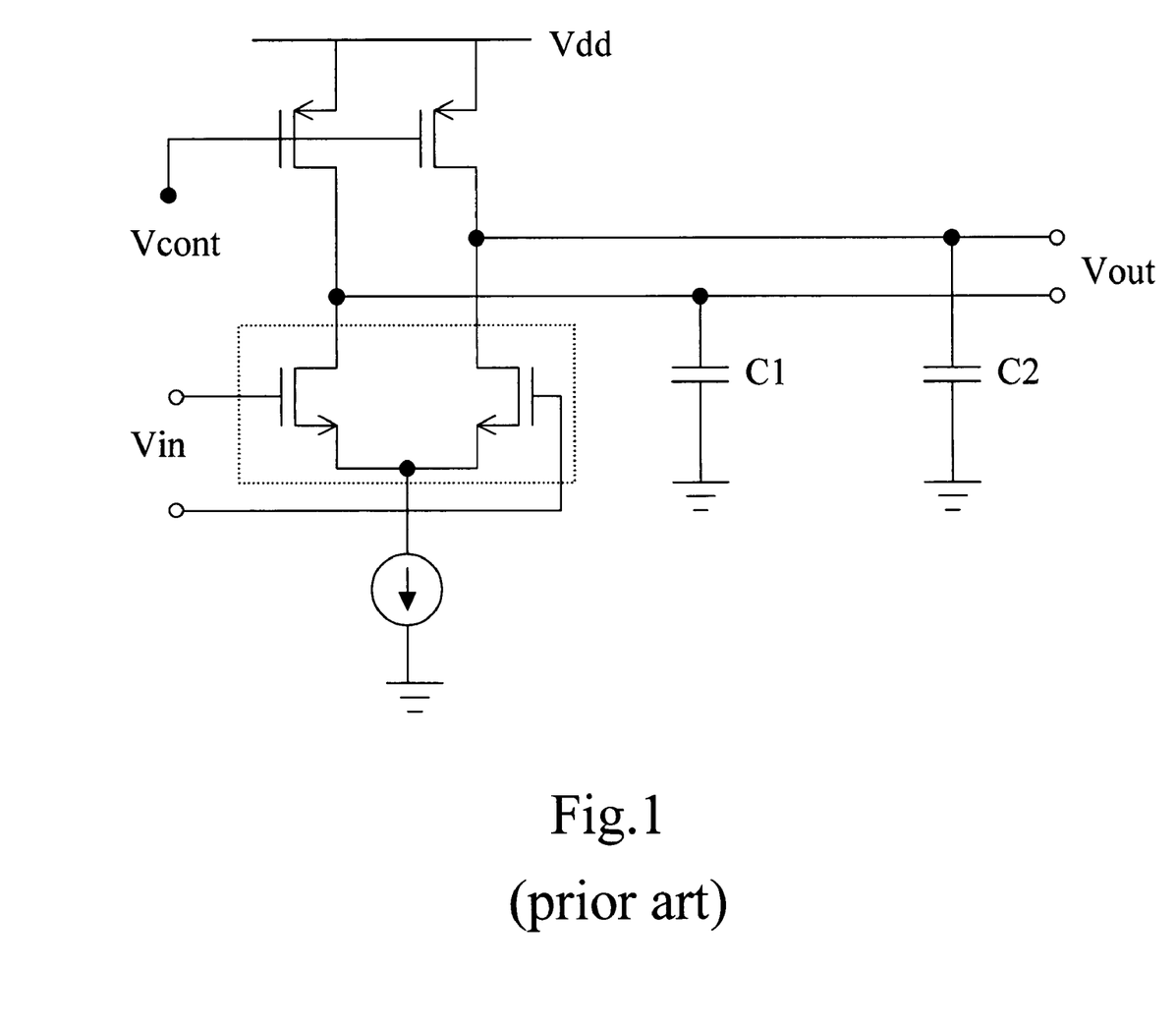
FIG. 1 is a schematic diagram of a differential pair of the delay cell in a ring oscillator.

Please refer to the text "Design of analog CMOS integrated circuits" written by Prof. Behzad Razavi, in chapter 14, page 513, the FIG. 14.42 describes an oscillator. FIG. 1 shows a differential pair of the delay cell in a ring oscillator, and this technology, which is well known by the person of ordinary skill in the art, changes the control voltage $V_{cont}$ of the transistors which are used as a loading device to control the oscillating frequency of the ring oscillator. However, the amplitude of the output signal $V_{out}$ will be changing accordingly, and this is something that a designer of voltage controller oscillators would not be willing to see

SUMMARY OF INVENTION

It is therefore a primary objective of the claimed invention to provide a voltage controller oscillator that when the control voltage is changed to adjust the output oscillating frequency, the variance of amplitude of the output signal is substantially reduced to control SNR in an acceptable range.

According to the claimed invention, a delay circuit is included in a ring oscillator, and the ring oscillator produces an oscillating signal. The delay circuit comprises a current source for providing a current; a first circuit coupled to the current source for receiving an input signal and producing an output signal; a second circuit coupled to the current source and the first circuit; a first adjustable impedance element coupled to the first circuit; a second adjustable impedance element coupled to the second circuit; and a control circuit coupled to the first adjustable impedance element and the second adjustable impedance element for producing a first control signal to control a first resistance of the first adjustable impedance element and producing a second control signal to control a second resistance of the second adjustable impedance element; wherein the first control signal produced by the control circuit includes a coarse-tuning element and a fine-tuning element for controlling the first resistance, the second control signal produced by the control circuit includes a coarse-tuning element and a fine-tuning element for controlling the second resistance.

According to the claimed invention, a delay circuit is included in a ring oscillator, and the ring oscillator produces an oscillating signal. The delay circuit comprises a current source for providing a current; a first circuit coupled to the current source for receiving an input signal and producing an output signal; a second circuit coupled to the current source and the first circuit; a first adjustable impedance element coupled to the first circuit; a second adjustable impedance element coupled to the second circuit; and a control circuit coupled to the first adjustable impedance element and the second adjustable impedance element for producing a first control signal to control a first resistance of the first adjustable impedance element and producing a second control signal to control a second resistance of the second adjustable impedance element; wherein the first adjustable impedance element includes at least one transistor operated in linear region, and the second adjustable impedance element also includes at least one transistor operated in linear region.

According to the embodiment of the claimed invention, a delay circuit is included in a ring oscillator, and the ring oscillator produces an oscillating signal. The delay circuit comprises a current source for providing a current; a first circuit coupled to the current source for receiving an input signal and producing an output signal; a second circuit coupled to the current source and the first circuit; a first adjustable impedance element coupled to the first circuit; a second adjustable impedance element coupled to the second circuit; and a control circuit coupled to the first adjustable impedance element and the second adjustable impedance element for producing a first control signal to control a first resistance of the first adjustable impedance element and producing a second control signal to control a second resistance of the second adjustable impedance element; wherein the first control signal produced by the control circuit includes a digital element and an analog element for controlling the first resistance, and the second control signal produced by the control circuit includes a digital element and an analog element for controlling the second resistance.

These and other objectives of the present invention will no doubt become obvious to those of ordinary skill in the art after reading the following detailed description of the preferred embodiment that is illustrated in the various figures and drawings.

10 delay cell
12 input pair
14 cross-coupled pair
16 first adjustable impedance element
18 second adjustable impedance element
20, 22 loading impedance element
24 current source
26, 28, 30, 32 control circuit

DETAILED DESCRIPTION

Figure 2:
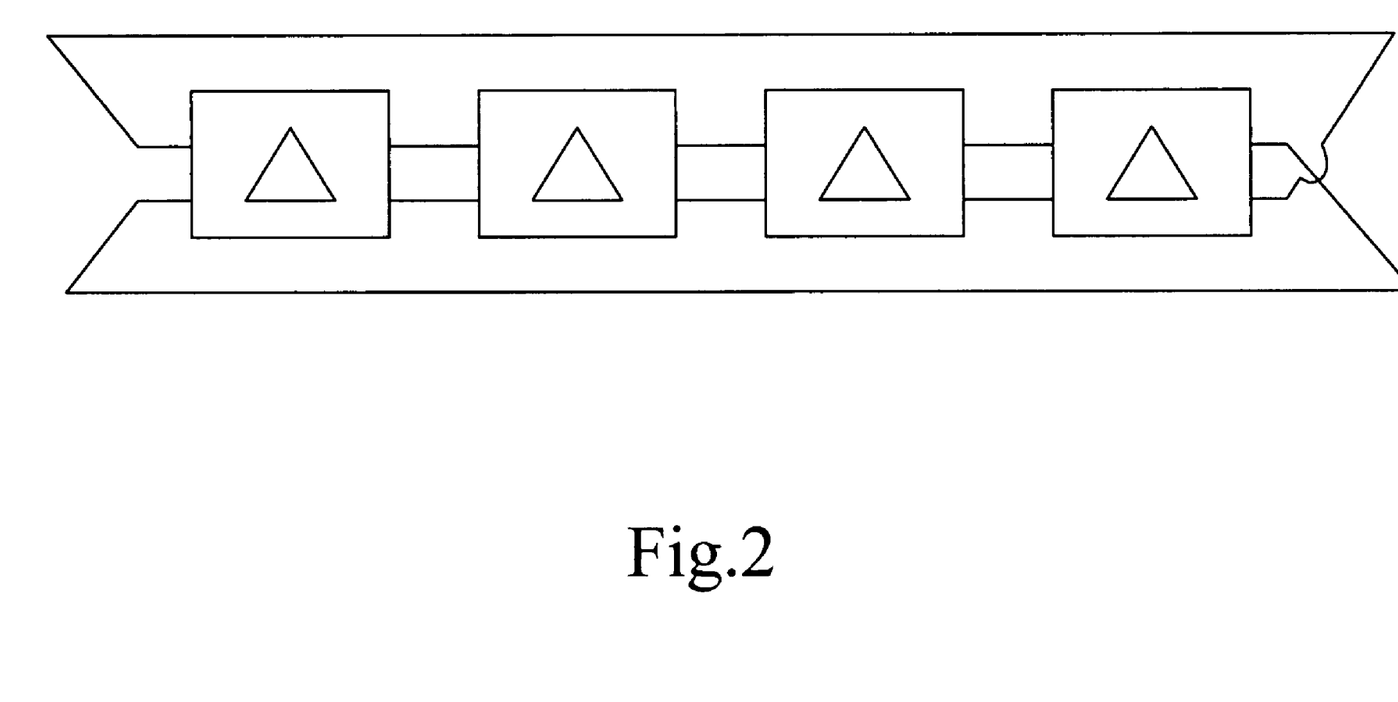
FIG. 2 is a schematic diagram of a ring oscillator according to an embodiment of the present invention.

Please refer to FIG. 2, which is a schematic diagram of a voltage controlled oscillator according to an embodiment of the present invention. The voltage controlled oscillator is a ring oscillator composed of a plurality of delay cells, wherein each delay cell is the differential module having the positive and negative input terminals and the positive and negative output terminals connected as shown in FIG. 2. The operation principle and the circuit formation of the ring oscillator are known by persons of ordinary skill in the art and need not being described here.

Figure 3:
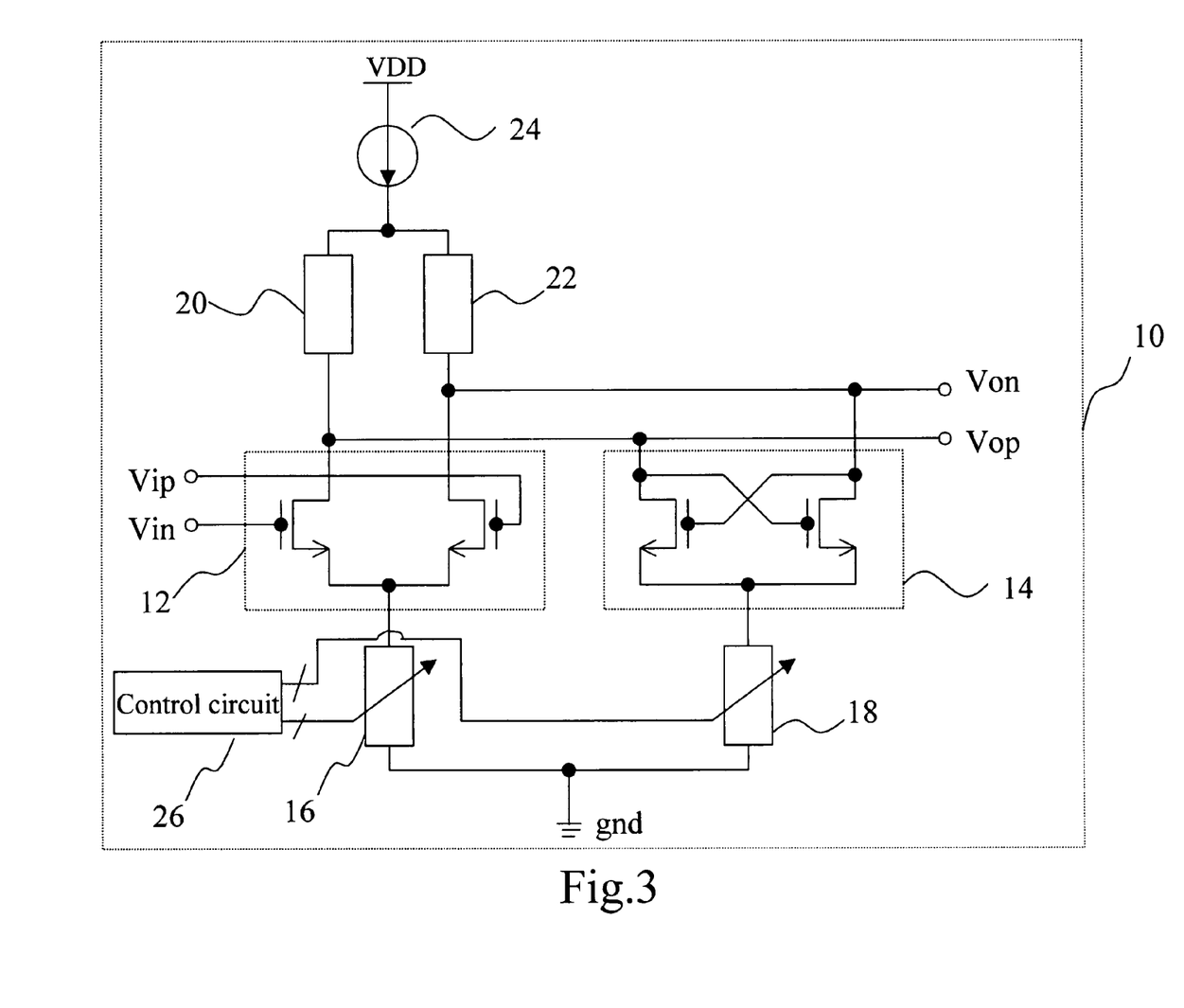
FIG. 3 is a schematic diagram of a delay cell in a ring oscillator according to an embodiment of the present invention.

Please refer to FIG. 3, which is a schematic diagram of a delay cell in a ring oscillator according to an embodiment of the present invention. The delay cell 10 includes an input pair 12, a cross-coupled pair 14, two adjustable impedance elements 16 and 18, two loading impedance elements 20 and 22, and a current source 24, which are coupled each other as shown in figure. In this embodiment, the input pair 12 is composed of two NMOS transistors for receiving the input signals (Vip, Vin) from the upper stage differentially and providing a gain. The cross-coupled pair 14 is also composed of two NMOS transistors connected in a cross-coupled way to act as the loading of the input pair for providing negative resistance.

The loading impedance elements 20 and 22 are also used as the loading of the input pair for transforming the current signal to the output signals (Von, Vop). The loading impedance elements 20 and 22 can be achieved by, but not limited to, the use of conventional technology, such as the diode-connected MOS transistors, the linear region MOS transistors, or the wire transistors. The current source 24 is used for providing a constant current to the input pair 12 and the cross-coupled pair 14. In this embodiment, the current source 24 is coupled between the power supply voltage source Vdd and the loading impedance elements 20 and 22, and it can be achieved by the conventional current mirror configuration.

The first adjustable impedance element 16 and the second adjustable impedance element 18 are individually coupled to the input pair 12 and the cross-coupled pair 14, and the resistances of these two adjustable impedance elements can be changed according to the control signals from a control circuit 26. Since the input pair 12 and the cross-coupled pair 14 use the same current source 24, if the resistances of the first adjustable impedance element 16 and the second adjustable impedance element 18 are adjusted, the current flowing through these two circuits 12 and 14 will be proportionally distributed to change the oscillating frequency of the ring oscillator. For example, if the control circuit 26 controls to increase the resistance of the first adjustable impedance element 16 and decrease the resistance of the second adjustable impedance element 18, more current will be distributed to the cross-coupled pair 18 to make it having larger transduction (gm), increase the delay of the delay cell and lower the oscillating frequency. The procedure of adjusting the two adjustable impedance elements 16, 18 are not limited to the way described above, any proportional variations of the two adjustable impedance elements 16, 18 are acceptable. However, this kind of oscillating frequency adjustment will not change the amplitude of the output signal, and that is because of the resistances of the loading impedance elements 20 and 22 and the current values of the current source 24 are all fixed. Thus, the SNR of the voltage controlled oscillator will not substantially change with the adjustment of the oscillating frequency.

In this embodiment, the first adjustable impedance element 16 and the second adjustable impedance element 18 can be achieved by using the same circuit formation. Please refer to FIG. 4, which includes five parallel connected MOS transistors M1, M2, M3, M4 and M5 operated in the linear region (or triode region). The control signal produced by the control circuit 26 includes a digital control signal element and an analog control signal element. The MOS transistors M1, M2, M3 and M4 are performed the digital control according to the digital control signal element, that is to say, these transistors will separately switch according to one bit of the digital control signal and change the resistance parallel connected to the adjustable impedance element. In this embodiment, sizes of these transistors are applicably planned to flow 1, 2, 4 and 8 times of the unit current while conducting, and the digital-operated circuit is utilized to achieve function of frequency coarse tuning. The MOS transistor M5 is performed the analog control according to the analog control signal element, that is to say, the resistance of M5 will be continuously changed according to an analog voltage value. In this embodiment, M5 can be planned to flow double of the unit current, and the analog-operated circuit is utilized to achieve function of frequency fine-tuning. What should be paid attention to is that the portion for producing the analog control signal element in the control circuit 26 can be achieved by a phase locked loop (PLL). This embodiment is neither meant for limiting the number of parallel connected MOS transistors nor is it meant for limiting the size of each transistor for regulation of the planned flow, and this should be well known by persons of ordinary skill in the art.

Figure 4:
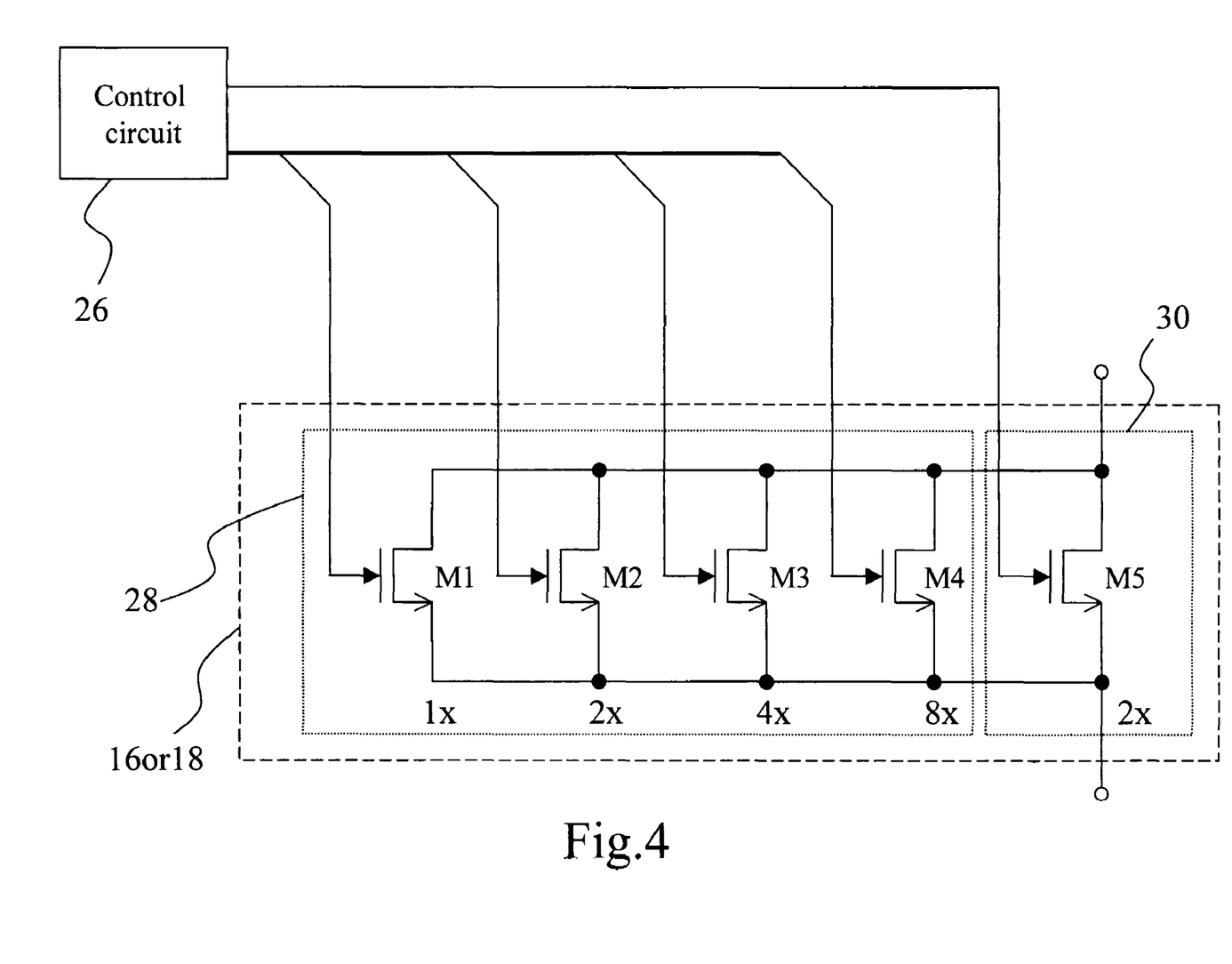
FIG. 4 is a schematic diagram of an adjustable impedance element according to an embodiment of the present invention.

For symmetrical considerations, when the oscillating frequency is changed, the control circuit 26 will control the resistances of the first adjustable impedance element 16 and the second adjustable impedance element 18 to reversely adjust the current flowing through. That is to say, when one current is increased, the other current will decrease the corresponding value. For example, if the analog control voltage for controlling the first adjustable impedance element 16 is increased, the analog control voltage for controlling the second adjustable impedance element 18 should be decreased; or if the digital control value for controlling the first adjustable impedance element 16 is increased by 1, the digital control value for controlling the second adjustable impedance element 18 is decreased by 1. What should be paid attention to is that the above-mentioned operation is only one of the preferred embodiments of the present invention, and not for limitation.

Figure 5:
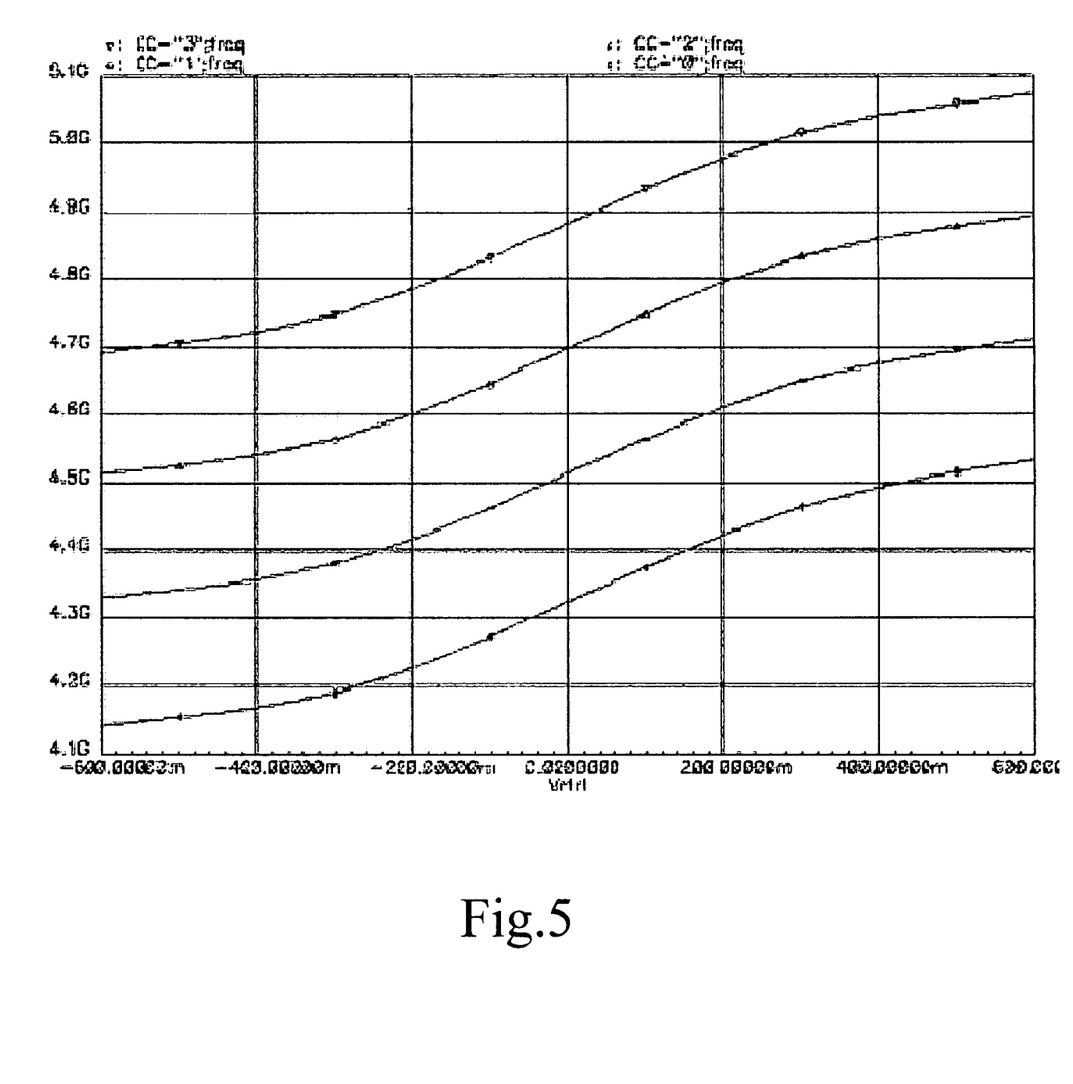
FIG. 5 is a diagram of voltage-frequency curve of the ring oscillator in FIG. 2.

FIG. 5 shows a voltage-frequency curve of the ring oscillator in FIG. 2. The X-axis is the voltage of the analog control signal, and the Y-axis is the frequency. These four curves, from bottom to top, show the situation when the digital control signal is 0, 1, 2 and 3, in another word, show the situation when the digital control signal controls M1-M4 to conduct 0, 1, 2, and 3 times the unit current.

Figure 6:
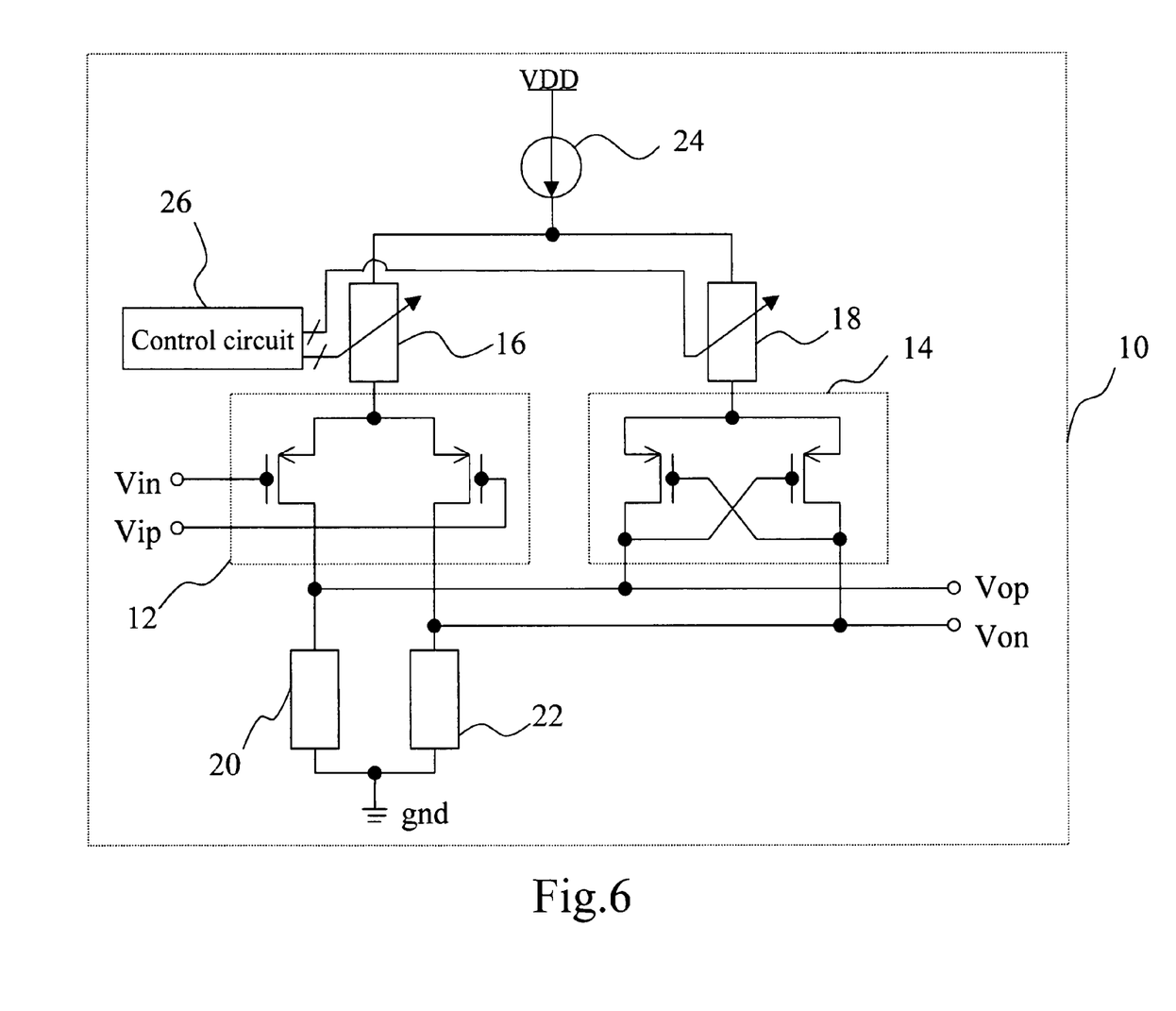
FIG. 6 is a schematic diagram of a delay cell according to another embodiment of the present invention.
Figure 7:
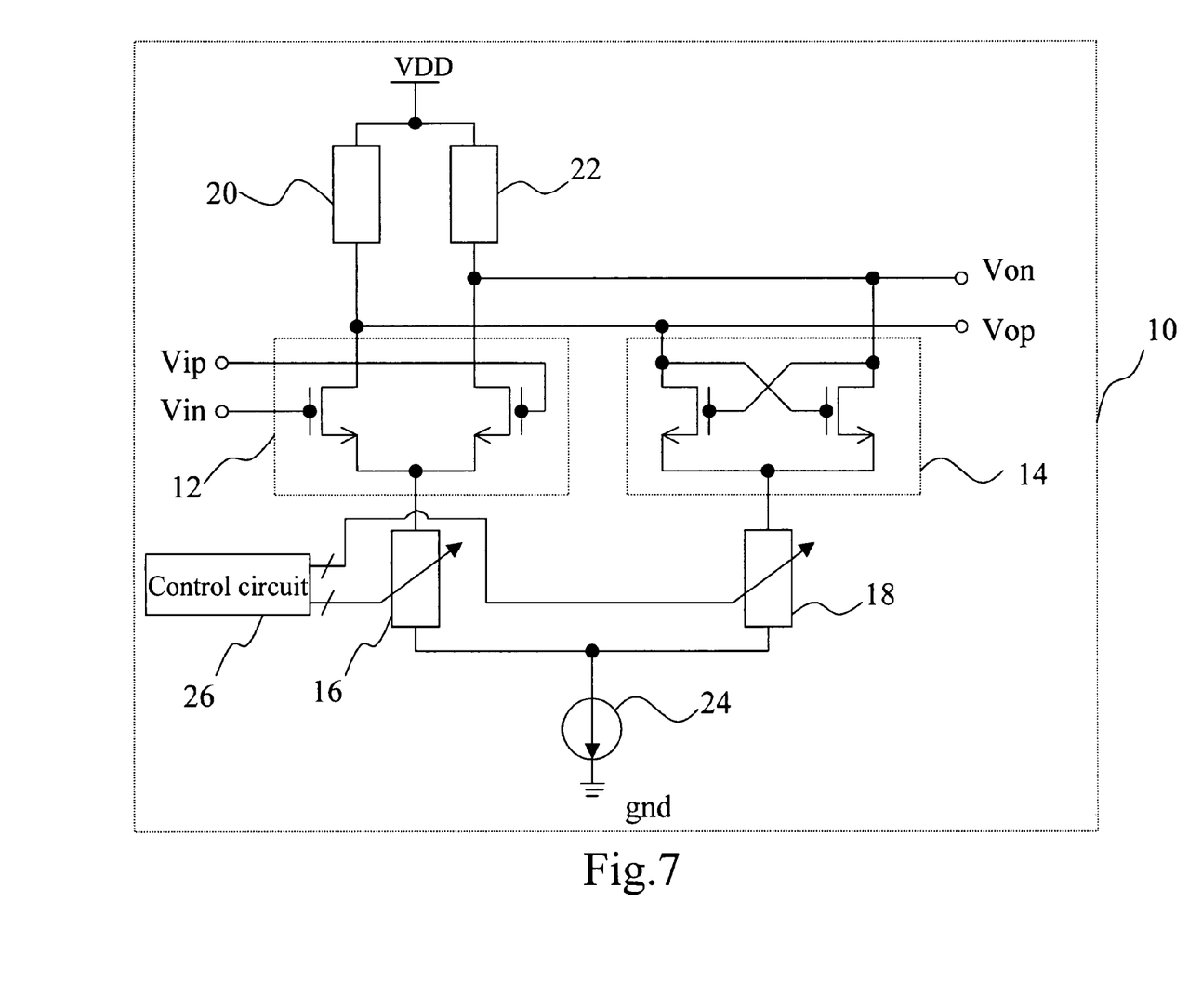
FIG. 7 is a schematic diagram of a delay cell according to a further embodiment of the present invention.

In addition, besides using NMOS devices to compose an input pair 12 and a cross-coupled pair 14 as the embodiment shown in FIG. 3, the present invention can be also achieved by using PMOS devices, as shown in FIG. 6. Further, the current source can be also coupled between the adjustable impedance element and the ground, as shown in FIG. 7.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A delay circuit, which is included in a ring oscillator, the ring oscillator produces an oscillating signal, the delay circuit comprising:
a current source for providing a current;
a first circuit coupled to the current source for receiving an input signal and producing an output signal;
a second circuit coupled to the current source and the first circuit;
a first adjustable impedance element coupled to the first circuit;
a second adjustable impedance element coupled to the second circuit; and
a control circuit coupled to the first adjustable impedance element and the second adjustable impedance element for producing a first control signal to control a first resistance of the first adjustable impedance element and producing a second control signal to control a second resistance of the second adjustable impedance element;
wherein the first control signal produced by the control circuit includes a digital coarse-tuning element and an analog fine-tuning element coupled in parallel for controlling the first resistance, the second control signal produced by the control circuit includes a digital coarse-tuning element and an analog fine-tuning element coupled in parallel for controlling the second resistance.

2. The delay circuit of claim 1, wherein the first circuit includes an input differential pair composed of two transistors.

3. The delay circuit of claim 1, wherein the second circuit includes a cross-coupled pair composed of two transistors.

4. The delay circuit of claim 1, wherein when the control circuit adjusts the first and second resistances via the first and second control signals, oscillating frequency of the oscillating signal on the ring oscillator is also changed.

5. The delay circuit of claim 1, wherein sum of the current flowing through the first and second circuits substantially equals the current provided by the current source.

6. The delay circuit of claim 1, wherein the first adjustable impedance element includes at least one transistor operated in linear region, and the second adjustable impedance element also includes at least one transistor operated in linear region.

7. A delay circuit, which is included in a ring oscillator, the ring oscillator produces a oscillating signal, the delay circuit comprising:
a current source for providing a current;
a first circuit coupled to the current source for receiving an input signal and producing an output signal;
a second circuit coupled to the current source and the first circuit;
a first adjustable impedance element coupled to the first circuit;
a second adjustable impedance element coupled to the second circuit; and
a control circuit coupled to the first adjustable impedance element and the second adjustable impedance element for producing a first control signal to control a first resistance of the first adjustable impedance element and producing a second control signal to control a second resistance of the second adjustable impedance element;
wherein all transistors of the first adjustable impedance element the second adjustable impedance element or both are operated in linear region.

8. The delay circuit of claim 7, wherein the first circuit includes an input differential pair composed of two transistors.

9. The delay circuit of claim 7, wherein the second circuit includes a cross-coupled pair composed of two transistors.

10. The delay circuit of claim 7, wherein when the control circuit adjusts the first and second resistances via the first and second control signals, oscillating frequency of the oscillating signal on the ring oscillator is also changed.

11. The delay circuit of claim 7, wherein sum of the current flowing through the first and second circuits substantially equals the current provided by the current source.

12. The delay circuit of claim 7, wherein the first control signal produced by the control circuit includes a coarse-tuning element and a fine-tuning element for controlling the first resistance, and the second control signal produced by the control circuit includes a coarse-tuning element and a fine-tuning element for controlling the second resistance.

13. The delay circuit of claim 7, wherein the first control signal produced by the control circuit includes a digital element and an analog element for controlling the first resistance, and the second control signal produced by the control circuit includes a digital element and an analog element for controlling the second resistance.

14. A delay circuit, which is included in a ring oscillator, the ring oscillator produces a oscillating signal, the delay circuit comprising:
25 a current source for providing a current;
a first circuit coupled to the current source for receiving an input signal and producing an output signal;
a second circuit coupled to the current source and the first circuit;
a first adjustable impedance element coupled to the first circuit;
a second adjustable impedance element coupled to the second circuit; and
a control circuit coupled to the first adjustable impedance element and the second adjustable impedance element for producing a first control signal to control a first resistance of the first adjustable impedance element and producing a second control signal to control a second resistance of the second adjustable impedance element;
wherein the first control signal produced by the control circuit includes a digital element and an analog element coupled in parallel for controlling the first resistance, and the second control signal produced by the control circuit includes a digital element and an analog element coupled in parallel for controlling the second resistance.

15. The delay circuit of claim 14, wherein the first circuit includes an input differential pair composed of two transistors.

16. The delay circuit of claim 14, wherein the second circuit includes a cross-coupled pair composed of two transistors.

17. The delay circuit of claim 14, wherein when the control circuit adjusts the first and second resistances via the first and second control signals, oscillating frequency of the oscillating signal on the ring oscillator is also changed.

18. The delay circuit of claim 14, wherein sum of the current flowing through the first and second circuits substantially equals the current provided by the current source.

19. The delay circuit of claim 14, wherein the first adjustable impedance element includes at least one transistor operated in linear region, and the second adjustable impedance element also includes at least one transistor operated in linear region.

* * * * *